(12) United States Patent
Wise

(10) Patent No.: US 7,968,352 B2
(45) Date of Patent: Jun. 28, 2011

(54) SUPERCONDUCTIVITY BASED ON BOSE-EINSTEIN CONDENSATION OF ELECTRON OR ELECTRON-HOLE PAIRS IN SEMICONDUCTORS

(76) Inventor: William G. Wise, Tarzana, CA (US)

( * ) Notice: Subject to any disclaimer, the term of this patent is extended or adjusted under 35 U.S.C. 154(b) by 0 days.

(21) Appl. No.: 12/955,197

(22) Filed: Nov. 29, 2010

(65) Prior Publication Data

US 2011/0129945 A1      Jun. 2, 2011

Related U.S. Application Data

(60) Provisional application No. 61/265,307, filed on Nov. 30, 2009.

(51) Int. Cl.
*H01L 21/00* (2006.01)
(52) U.S. Cl. ............................................. 438/2; 257/661
(58) Field of Classification Search ....... 438/2; 257/661
See application file for complete search history.

(56) References Cited

U.S. PATENT DOCUMENTS 5,016,064 A * 5/1991 Goronkin ........................ 257/14
5,142,341 A * 8/1992 Goronkin et al. ............... 257/15

* cited by examiner

*Primary Examiner* — Jarrett J Stark
*Assistant Examiner* — Nicholas Tobergte
(74) *Attorney, Agent, or Firm* — Bruce A. Jagger

(57) ABSTRACT

The invention describes a method of achieving superconductivity in Group IV semiconductors via the addition of doubly charged impurity atoms to the crystal lattice. The doubly charged impurities function as composite bosons in the semiconductor. Increasing the density of the composite bosons to a level where their wavefunctions overlap, results in the formation of a Bose condensate. The concentration of the doubly charged impurity atoms in the host lattice and the binding energy of the impurities are important factors in determining whether a Bose condensate will form. Doubly charged impurities must be present in the semiconductor at a concentration at which they exhibit overlapping wavefunctions, but still exist within the crystal lattice as bosons.

5 Claims, No Drawings

U.S. 7,968,352 B2

SUPERCONDUCTIVITY BASED ON BOSE-EINSTEIN CONDENSATION OF ELECTRON OR ELECTRON-HOLE PAIRS IN SEMICONDUCTORS

RELATED APPLICATIONS

This application claims the benefit of U.S. Provisional Application No. 61/265,307 filed Nov. 30, 2009, the content of which is incorporated by this reference in its entirety for all purposes as if fully set forth herein.

BACKGROUND OF THE INVENTION

1. Field of the Invention

The claimed subject matter relates to superconductivity exhibited in semiconductor materials containing high levels of doubly charged impurities, and particularly to superconductivity in semiconductors doped with doubly charged impurities to such a level that the wavefunctions of the doubly charged impurities overlap and the formation of a Bose condensate occurs.

2. The Related Art

Superconductivity is characterized by the absence of electrical resistance and the exclusion of the interior magnetic field. In many materials that exhibit superconductivity, this phenomenon occurs only at very low temperatures on the order of less than approximately 2 degrees Kelvin. Some few materials, such as certain copper oxides, are characterized as being "high temperature superconductors." The highest temperature at which superconductivity first appears in a material is defined as the "critical temperature" of that superconductive material. A few materials, such as certain copper oxides (Perovskites), are known to exhibit critical temperatures in excess of 77 degrees Kelvin (which is the boiling point of nitrogen at atmospheric pressure). A mercury based cuprate superconductor, for example, has been found that has a critical temperature above 130 degrees Kelvin. For materials with critical temperatures below about 10 degrees Kelvin, difficult and expensive procedures are required to depress their temperatures to the point where superconductivity is exhibited. This limits the practical applications in which they may be employed. High temperature superconductors have been employed in a number of practical applications, including, for example, electromagnets, mass spectrometers, and magnetic separators. There is a recognized need for high temperature superconductors.

In general, the most useful high-temperature superconductors have critical temperatures well above the boiling point of liquid nitrogen (77 degrees Kelvin). Liquid nitrogen is readily available, so it is feasible to utilize the superconducting characteristics of high-temperature superconductors that exhibit critical temperatures above 77 degrees Kelvin for practical applications such as, for example, in MRI machines.

The frictionless flow of bosons is a characteristic of a Bose condensate. Bose condensates are composed of boson particles, such as bound pairs of electrons. Bose condensates are a phase of matter.

Semiconductor materials are conventionally doped with donor or acceptor impurities using one or more widely known and practiced doping procedures. Dopants are conventionally inserted into the crystal lattices of semiconductor materials using such procedures as ion implantation, diffusion, growth from a melt, and epitaxial techniques such as molecular beam epitaxy or vapor phase epitaxy.

Donor dopants provide electrons, and acceptor dopants provide electron-holes. The dopant ions are trapped within the crystal lattices of the semiconductor materials. The dopants are impurities within the crystal lattices of the semiconductors. Doped semiconductor materials are the basic building blocks upon which most electronic devices depend.

A "degenerate" semiconductor is one that has been doped with sufficient donor or acceptor impurities to, among other things, cause the material to act more like a conductor than a semiconductor. The dopant concentrations in most semiconductor devices are generally well below the degenerate level of doping. The properties of degenerate semiconductor materials are generally intermediate between those of metals and semiconductors. The concentration at which a semiconductor becomes degenerate is unique for each semiconductor material-dopant combination. A degenerate condition exists where the wavefunctions of bound electrons or electron acceptors (holes) overlap. Bound electrons are sometimes described herein as donors, and bound electron acceptors are sometimes described as holes. Both are described herein as impurities. Impurities are bound in the crystal lattice of the host semiconductor material. Such bound impurities are described as impurities because they are different from the atoms that make up the pure host crystal lattice, and not to indicate that they are in any sense undesirable.

There is a need for high temperature superconductors. There is a particular need for high temperature superconductors that, for the most part, can be produced using the existing infrastructure that currently exists for the manufacture of doped semiconductors for use in the electronics industry.

In general, dopants in semiconductor materials may act as singly charged or doubly charged impurities depending on the semiconductor material-dopant combination. A vast amount of research has been reported on such combinations with singly charged impurities wherein the semiconductor materials are lightly doped (well below degenerate concentrations). Some reported research has been carried out on semiconductor materials lightly doped (well below the degenerate level of concentration) with doubly charged impurities. Such research has been primarily aimed at developing new semiconductor devices for use in the electronics industry.

A very limited amount of research (compared to the amount devoted to the electronics industry) has been reported on attempts to use semiconductor material-dopant combinations to achieve superconductivity. Superconductivity has been reported, for example, for silicon, silicon carbide, and diamond doped with boron (a single donor), and germanium doped with gallium (a single donor). Some success has been reported in achieving high-temperature superconductivity at temperatures above about 77 degrees Kelvin with certain copper oxide semiconductor materials doped with electron-holes.

Germanium doped with Be or Zn to a concentration of around $10^{18}$ Be or Zn atoms per cubic centimeter of Ge have been described for use as doping pieces. The highly doped doping pieces were described as being added to melts of Ge to produce melts with carefully controlled low dopant concentrations in Ge crystals. See Haller et al., U.S. Pat. No. 6,011,810, which is hereby incorporated herein as though fully set forth hereat. In the event of any conflict or inconsistency between the teachings herein and references that are incorporated by reference, the teachings herein shall prevail.

SUMMARY

Embodiments of the claimed subject matter provide methods and systems whereby superconductivity will be achieved. Embodiments will also permit superconductivity to be achieved at high temperatures. For example, embodiments will also permit superconductivity to be achieved at temperatures above about 77 degrees Kelvin in heavily doped semiconductor materials.

The useful semiconductor materials according to the invention will be Group IV materials doped with doubly charged impurities. Useful semiconductor materials will be, diamond, silicon, germanium, silicon carbide, and silicon-germanium alloys. According to certain embodiments, single crystal semiconductor materials will be used. Useful dopants will be doubly charged (donors or acceptors) in the particular semiconductor crystal with which they are paired. Such doubly charged dopants include beryllium, magnesium, calcium, zinc, strontium, cadmium, barium, mercury, oxygen, sulfur, manganese, selenium, chromium, cobalt, iron, nickel, palladium, platinum, titanium, zirconium, hafnium, tellurium, and mixtures thereof. The doubly charged impurities may also be described herein as, impurities, impurity atoms, dopants, dopant atoms, or doubly charged dopants. These terms are used interchangeably unless otherwise indicated.

According to embodiments of the invention, doubly charged dopants will be present in the semiconductor material in a concentration at which these doubly charged dopants exhibit overlapping wavefunctions, but still exist within the crystal lattice as bosons. These two conditions (overlapping wavefunctions and existing within the crystal lattice as bosons) generally bracket the operable range of doubly charged dopant concentrations. Superconductivity will not occur unless the wavefunctions of the doubly charged dopants overlap. If the concentration of doubly charged dopants exceeds the level where the bound state at the impurities disappears, superconductivity does not occur. Bose condensates form only if the doubly charged dopants exist within the lattice of the crystalline semiconductor. If the concentration of the dopants reaches the point where the dopants are no longer bound as bosons within the crystal lattice, a Bose condensate will not form. For most semiconductor material-dopant combinations the range of effective doubly charged dopant concentrations will be within approximately 2 orders of magnitude of $10^{21}$ atoms per cubic centimeter. According to certain embodiments, the range of doubly charged dopant atoms is from about $10^{19}$ to $10^{23}$ atoms per cubic centimeter. In general, the effective concentration is that at which the non-metal semiconductor starts to transition into a degenerately doped, metallic like state. The operable range of doubly charged dopant concentrations varies from one semiconductor material-dopant combination to another, and is determined empirically for each such combination. This empirical determination is conducted in accordance with the teachings herein. At these very high concentrations of doubly charged impurity atoms in a semiconductor, there is generally no sharp transition from bound impurities to free impurities at a particular dopant concentration. There is generally a gradual change where the binding energy of the dopant is reduced to zero as the concentration of the dopant increases.

Some semiconductor material-dopant combinations will be more useful than others. In those embodiments where the operable range of doubly charged dopant concentration is very small, repeatability may be difficult to achieve. The cooling requirements necessary to achieve superconductivity in materials with critical temperatures below about 77 degrees Kelvin sometimes make it difficult to use such materials in practical applications. Some applications in outer space are particularly suitable for superconductors with critical temperatures below about 77 degrees Kelvin.

The objective of adding doubly charged impurity atoms to a semiconductor is to create a Bose condensate of electron pairs or electron-hole pairs in the semiconductor material-dopant combination. The doubly charged impurity atoms function as composite bosons in the host lattices of the semiconductor crystals. Sufficient doubly charged impurity atoms are added to a host lattice to achieve a concentration where the wavefunctions of the composite bosons trapped at the doubly charged impurities overlap. The concentration of the doubly charged impurities in the host lattice, and the binding energy of the impurity atoms are important factors in determining whether a Bose condensate will form. If the binding energy is too large, the wavefunctions are highly localized, which prevents any overlap with neighboring bosons. If the binding energy is too small, the electron pairs or the electron hole pairs will be ionized by a minimum amount of thermal energy, and the boson formed by the impurity will be destroyed. If the doping concentration is too low, the wavefunctions will not overlap. If the doping concentration is too high, the semiconductor material-dopant combinations transition to a metallic state with no binding energy between the electron pairs or the electron-hole pairs, and no Bose condensate will form.

Doubly charged impurities are used to provide a much more stable Bose condensate than is possible with singly charged impurities. Doubly charged impurities will permit the occurrence of superconductivity at atmospheric pressure and critical temperatures above about 77 degrees Kelvin.

DETAILED DESCRIPTION OF THE EMBODIMENTS

In the following description, numerous specific details are set forth in order to provide a thorough understanding of the various embodiments of the claimed subject matter. One skilled in the relevant art will recognize, however, that these embodiments can be practiced without one or more of the specific details, or with a number of other methods or components.

References throughout this specification to "one embodiment" or "an embodiment" means that a particular feature, structure, step, or characteristic described in connection with the embodiment is included in at least one embodiment of the present claimed subject matter. Thus, the appearances of the phrases "certain embodiments" or "additional embodiment," or phrases of similar meaning in various places throughout this specification are not necessarily all referring to the same embodiment. Furthermore, the particular features, structures, steps, or characteristics may be combined in any suitable manner in one or more embodiments.

It is known that Mg ions at concentrations below the degeneracy level in a Ge single crystal act as doubly charged impurities (double acceptors). Superconductivity had not previously been observed in Mg doped Ge crystals. A single crystal of germanium will be doped with magnesium ions to a degenerate level that will exhibit superconductivity when cooled to cryogenic temperatures above 1 degree Kelvin at atmospheric pressure. The Ge crystal will have a high degree of purity as indicated by an initial resistivity greater than about 35 Ohm-cm at about 20 degrees centigrade. The Ge crystal will be doped with Mg by conventional ion implantation procedures using an implantation temperature of approximately 300 degrees Kelvin, an implantation energy of approximately 50 keV, and a Mg ion dosage level of greater than $1.0 \times 10^{16}$ atoms per square centimeter. The degenerate Mg doped Ge semiconductor recovered from this ion implantation process will contain a peak doping concentration greater than $1 \times 10^{21}$ Mg atoms per cubic centimeter of Ge crystal. This Mg doped Ge semiconductor will then be annealed for about two hours at about 600 degrees centigrade in an inert atmosphere of nitrogen to repair the damage done to the crystal lattice during the implantation process, and to cause the implanted atoms to migrate and thus distribute themselves more uniformly throughout the lattice of the host Ge crystal. The crystal lattice of the semiconductor material tends to break down at high dosages of dopant, and at elevated temperatures. The crystal lattice may be restored somewhat by annealing after the dopant implantation is completed. When cooled to a cryogenic temperature above 1 degree Kelvin the electrical resistance in the semiconductor will drop sharply, indicating a phase transition to a Bose condensate where superconductivity is achieved.

It is believed that the binding energy that holds the doubly charged impurities together within the crystal lattice will become the boson pair binding energy at the point where Bose condensation occurs (when the wavefunctions of neighboring bosons overlap).

Deep-level transient spectroscopy (DLTS) is used to characterize the activation energies of the Mg double acceptor ions to confirm that they are behaving as double impurities. The degree of overlap of the wavefunctions is characterized by the low temperature electrical conductivity as well as the temperature dependence of the electrical conductivity. Electrical conductivity increases with increasing temperature in semiconductor materials, and decreases with increasing temperature in metals. When the semiconductor is degenerately doped, the free electron concentration will no longer be temperature dependent or it will be very weakly temperature dependent.

Wavefunctions describe the spatial extent of double donors or double acceptors in the semiconductor. The term Bohr radius or effective Bohr radius may be used to describe this spatial extent. According to quantum mechanics, the charges trapped at dopants in a crystal lattice are not completely localized. They spread out from the impurity by an amount inversely proportional to their binding energy. When the wavefunctions of adjacent dopants in a solid overlap, the trapped charges are no longer localized to a particular impurity. These charges can be found on adjacent impurity atoms because they tunnel through the impurity potential hill separating the impurity atoms. When that starts to happen, the properties of the semiconductor become more metal-like and less semiconductor-like. In addition, an impurity band starts to form.

Certain embodiments will exhibit superconductivity at temperatures above 1 degree Kelvin while others will exhibit superconductivity at temperatures above about 4 degrees Kelvin, and still further embodiments will exhibit superconductivity above about 77 degrees Kelvin.

According to certain embodiments, a method of achieving superconductivity in a semiconductor material comprises selecting a semiconductor material from the group consisting essentially of diamond, silicon, germanium, silicon carbide, and silicon germanium alloys doped with one or more doubly charged impurities in the semiconductor material. The doubly charged impurities being present in the semiconductor material in a concentration at which the doubly charged impurities exhibit overlapping wavefunctions and a Bose condensate forms at a critical temperature. The semiconductor material is cooled to the critical temperature, and a Bose condensate is allowed to form.

According to a further embodiment, the semiconductor material is doped with one or more doubly charged dopants selected from the group consisting essentially of beryllium, magnesium, calcium, zinc, strontium, cadmium, barium, mercury, oxygen, sulfur, manganese, selenium, chromium, cobalt, iron, nickel, palladium, platinum, titanium, zirconium, hafnium, tellurium, and mixtures thereof to form semiconductor material-dopant combinations. The dopants act as doubly charged impurities in the semiconductor material. The doping is applied to provide a concentration of doubly charged impurities in the semiconductor material at which the doubly charged impurities exhibit overlapping wavefunctions and a Bose condensate forms at the critical temperature.

There are several indicators for overlapping wavefunctions. The appearance of superconductivity at cryogenic temperatures is an indicator of overlapping wavefunctions. If superconductivity is not present, the nature of the electrical conductivity of the semiconductor material-dopant combination should be determined. If the electrical conductivity of the test specimen decreases linearly with increasing temperature, the combination is behaving like a metal, and bosons may not form because the concentration of dopant is too high. If the electrical conductivity of the test specimen increases logarithmically with increasing temperature, the test specimen is behaving like a semiconductor, and it may be necessary to slightly increase the concentration of the dopant atoms in the sample to achieve overlapping wavefunctions.

For a particular semiconductor that is being implanted by an ion implantation process, the implantation depth is strongly influenced by the dopant mass and crystal orientation (for example, <110>, <111>, <100>, or the like) with respect to the trajectory of the ion that is being implanted. According to conventional procedures, ion implantation is generally performed at an angle of approximately 7 degrees off the normal to the surface of the semiconductor material in which the ions are being implanted to prevent "channeling" of the dopants within the semiconductor material. The two main parameters to adjust for controlling the doping concentration in a semiconductor using ion implantation are the implantation energy, which controls the projected range of the dopants in the semiconductor material, and the dose, which when combined with the projected range controls the peak doping concentration in the semiconductor material. The dose, implantation energy, and post implant annealing steps will be different for achieving superconductivity in each semiconductor material-dopant combination. These three parameters are adjusted in an iterative process so that: 1) the dopants are incorporated into the host lattice as doubly charged impurities with minimal crystal lattice damage, and 2) the dopants are incorporated into the host lattice at sufficient concentration for the wavefunctions of neighboring impurity atoms to overlap.

An individual implanted ion undergoes scattering events with electrons and atoms in the host lattice of the semiconductor material during implantation. This reduces the ion's energy until it comes to rest within the semiconductor material. Point defects and even small amorphous disorder zones may result. The total path length of the ion is called the range, R. The stopped ions are distributed within the body of the semiconductor material. The average distance a group of implanted ions travel into the surface is called the projected range, Rp. The projected range, Rp, of implantation is influenced by the mass of the implanted atoms. Also, more massive atoms create more damage to the implanted substrate. Some ions are statistically "lucky" (that is—they encounter fewer scattering events in a given distance in the semiconductor material), and come to rest beyond the projected range. Other ions are "unlucky" (that is—they have more than the average number of scattering events), and come to rest between the surface and the projected range. The standard deviation of the projected range is called the straggle, DELTA Rp. The number of ions applied to the semiconductor material per unit area during implantation is generally termed the dose. The dose (in atoms/cm$^2$) is related to beam current (in amperes), beam area (in cm$^2$), and implantation duration (in sec). The implantation energy according to certain embodiments ranges from as low as approximately 10 keV to as high as approximately 500 keV or more. In general, the higher the implantation energy the more damage occurs to the host crystal lattice during implantation.

The formation of a Bose condensate is possible under conditions where the wavefunctions of the impurities overlap but where the doubly charged impurities still exist within the crystal lattice of the semiconductor. As soon as the dopant level in semiconductor materials reaches the point at which the doubly charged impurities no longer bind their charges together as bosons, the formation of a Bose condensate becomes impossible. Superconductivity does not occur in the absence of paired charge carriers.

Group IV semiconductors have the innate ability to allow higher concentrations of double impurities than semiconductors from other Groups. A doubly charged dopant atom in Group IV semiconductors will retain its charge regardless of which atomic site it occupies (about 100 percent of the atomic sites will be available to a doubly charged impurity for creating boson traps). For example, a Be ion incorporated into a SiC crystal is a doubly charged substitutional impurity. The Be atom can occupy either a Si or a carbon site. Beryllium has two valence electrons and both Si and C have four valence electrons. If Be ends up on either a C or a Si site, it will be two electrons shy of completing the full bonding with its four nearest neighbor atoms. Thus, Be is a double acceptor impurity on both lattice sites.

Where dopants are inserted into a semiconductor crystal after the crystal is formed, the doped crystal should be annealed to repair the damage done during the dopant insertion operation. Also, annealing tends to increase the uniformity of the distribution of the dopants throughout the crystal lattice. In general, the higher the dopant concentration in the crystal, the more damage its insertion does to the crystal. The amount of disruption of the crystal lattice is determined primarily by the concentration of the dopant in the interstices of the crystal lattice, and to a lesser degree by the implantation temperature. The dopant mass and implantation energy also influence the amount of crystal lattice damage. Annealing is generally accomplished in an inert atmosphere such as, for example, Ar, He, N, or the like. The atmosphere should be substantially non-reactive with both the semiconductor and the dopant at the annealing temperature. The annealing temperature generally ranges from approximately 35 to 70 percent of the melting point of the semiconductor material-dopant combination.

Because the concentration of doubly charged impurities may not be uniform throughout a semiconductor crystal, it will be possible to achieve superconductivity in part, but not all of a crystal. A sudden and sharp drop in the electrical resistance across the crystal to a value greater than zero will be indicative of the occurrence of superconductivity in part, but not all of the crystal. For most applications a substantially uniform distribution of dopant is generally desired, however, for purposes of determining the optimum concentration of dopant it may be desirable to use a test specimen with a non-uniform dopant concentration. The sudden drop or step in electrical conductivity to a value greater than zero ohms at cryogenic temperatures will indicate that at least one of the regions in the test specimen is exhibiting superconductivity. Even a small region of superconducting material within the non-superconducting bulk sample will show up in the resistance measurement. Probing various regions in the specimen will isolate and identify the region that is exhibiting superconductivity.

Some dopants act as double acceptors, and some act as double donors in the host lattices of particular semiconductors. For example, Be, Mg, Zn, Sr, Cd, Ba, O, S, and Ni act as double acceptors in Si, while Ti, Zr, Hf, Cr, Se, Co, Pd, and Pt act as double donors in Si. Further, Be, Mg, Zn, Cd, Hg, Cr, Mn, Fe, and Ni act as double acceptors in Ge, and S, Se, and Te act as double donors in Ge.

While the detailed description of the claimed subject matter has been described with reference to multiple embodiments, it should be understood by those skilled in the art that various changes and modifications may be made and equivalents may be substituted for elements thereof without departing from the scope of the claimed subject matter. Therefore, the claimed subject matter is not limited to the various disclosed embodiments including the best mode contemplated for carrying out the claimed subject matter, but instead includes all possible embodiments that fall under the subject matter to be claimed.

What is claimed is:

1. A method of achieving superconductivity in a semiconductor material comprising:
    selecting a said semiconductor material from the group consisting essentially of diamond, silicon, germanium, silicon carbide, and silicon germanium alloy doped with one or more doubly charged impurities in said semiconductor material, said doubly charged impurities being present in said semiconductor material in a concentration at which said doubly charged impurities exhibit overlapping wavefunctions and a Bose condensate forms at a critical temperature;
    cooling said semiconductor material to about said critical temperature; and
    allowing said Bose condensate to form.

2. A method of achieving superconductivity of claim 1 wherein cooling is carried out to a temperature above at least about 77 degrees Kelvin.

3. A method of achieving superconductivity in a semiconductor material comprising:
    selecting a said semiconductor material from the group consisting essentially of diamond, silicon, germanium, silicon carbide, and silicon germanium alloy doped with one or more doubly charged impurities in said semiconductor material, said doubly charged impurities being present in said semiconductor material in a concentration at which said doubly charged impurities exhibit overlapping wavefunctions and a Bose condensate forms at a critical temperature, said doubly charged impurities being selected from the group consisting essentially of beryllium, magnesium, calcium, zinc, strontium, cadmium, barium, mercury, oxygen, sulfur, manganese, selenium, chromium, cobalt, iron, nickel, palladium, platinum, titanium, zirconium, hafnium, tellurium, and mixtures thereof;
    cooling said semiconductor material to about said critical temperature; and
    allowing said Bose condensate to form.

4. A method of achieving superconductivity in a semiconductor material according to claim 3 wherein said semiconductor material is germanium and said doubly charged impurity is magnesium.

5. A method of achieving superconductivity in a semiconductor material according to claim 3 wherein said semiconductor material is silicon and said doubly charged impurity is magnesium.

* * * * *